United States Patent [19]

Thillays

[11] 4,237,382
[45] Dec. 2, 1980

[54] PHOTOCOUPLER DEVICE

[75] Inventor: Jacques C. Thillays, Herouville-St-Clair, France

[73] Assignee: U.S. Philips Corporation, New York, N.Y.

[21] Appl. No.: 896,497

[22] Filed: Apr. 17, 1978

[30] Foreign Application Priority Data

Apr. 18, 1977 [FR] France .................................. 77 11606

[51] Int. Cl.³ ............................................. H01J 39/12
[52] U.S. Cl. ...................................... 250/551; 357/19
[58] Field of Search ......................... 250/551; 357/19; 307/311

[56] References Cited

U.S. PATENT DOCUMENTS

| 3,110,813 | 11/1963 | Sack | 250/551 X |
| 3,153,149 | 10/1964 | Finigian . | |
| 3,845,318 | 10/1974 | Thillays | 250/551 |

OTHER PUBLICATIONS

Cole, "Electronics", Mar. 18, 1976, p. 133.

Primary Examiner—David C. Nelms
Assistant Examiner—Darwin R. Hostetter
Attorney, Agent, or Firm—T. A. Briody; D. R. Treacy; M. D. Schechter

[57] ABSTRACT

A photocoupler device with an insulating element comprising a shield situated perpendicularly to the optical axis of a light emitter and a receiver. The shield comprises a thermoplastic transparent material.

11 Claims, 8 Drawing Figures

PHOTOCOUPLER DEVICE

BACKGROUND OF THE INVENTION

The present invention relates to an optoelectronic photocoupler device, comprising, opposite to each other in approximately parallel planes, a light emitter and a photosensitive receiver, both having semiconductor crystals the emitter and the receiver are coupled optically along an axis which is substantially perpendicular to the said planes and each is connected to electric connections. The photocoupler device further comprises a shield for providing electric insulation between the light emitter and the receiver the principal plane of the shield being perpendicular to the optical axis.

Such a photocoupler device is applicable notably in telephony.

Several opto-electronic combinations are known which are composed of an emitter and a receiver which are coupled optically so as to transfer electric information from the emitter to the said receiver through a light signal.

From a mechanical point of view, the assembly which is most current up till now consists of assembling face to face the light emitter and the said light receiver connected by a transparent resin, while ensuring that they are situated on the same optical axis perpendicular to the planes of the light emissive and the light sensitive faces.

In general, an electroluminescent semiconductor diode is used as an emitter and a photodiode, a phototransistor, or a photoresistor is used as a receiver.

From the electrical point of view, it is necessary to determine an optimum distance between the emitter and the receiver since this affects both the value of the transfer function and the value of the isolation.

In a photocoupler device the value of the insulation between the emitter and the receiver is a fundamental characteristic related not only to the distance which they are separated, but also to the distance which separates the connection wires and to the quality of the interstitial insulations.

During the assembly of the light emitter and the light receiver it is necessary to keep the connection wires spaced apart. However, there always remains a fair chance that these two wires will be comparatively close together, which may be due to the topology of the emitter and/or the receiver or even due to the length of the wires. In this case, the proximity of two wires results in a zone of low impedance. In addition the transparent resin, which is chosen to ensure optical transmission, and electrical insulation may, contain a certain number of defects. The resin may notably be influenced by reversion phenomena or depolymerisation phenomena due probably to the confinement in an evacuated space. The phenomenon of ionization may also be mentioned which characterizes certain resins containing either impurities such as hydrolysable chlorine, or metallic ions, or certain resins presenting a molecular lattice which is too wide to stop a diffusion of external impurities.

In addition, numerous devices operate in difficult current and/or voltage conditions. This is the case notably with devices used in the automobile industry. The components constituting these devices are then subjected to thermal and electrical strains which produce mechanical and electrical disturbances.

In order to meet these types of disadvantages an insulating element has already been used in the form of a shield interposed between the light emitter and the light receiver.

Such a shield used notably in photocouplers produced by the Societe General Electric consists of by a thin sheet of glass adhered, by means of a silicon resin, to metallic surfaces deposited on semiconductor crystals in which the emitter and the receiver have been produced.

This solution still presents several disadvantages. In fact, due to the difference between their coefficients of expansion, the adhesion between the glass sheet and the layer of resin is not easy to produce and is not reliable. So, if faults are produced at the level of the interface between the sheet and the resin layer, these faults provide as many paths for stray leakage currents. Moreover, the manipulation of the sheet and its assembly between the emitter and the receiver is difficult considering the small dimensions of the sheet and its fragility. For reasons of light transfer efficiency it is necessary for the dimensions of the sheet to remain small, in particular as regards its thickness.

Moreover, the sheet of glass does not easily dissipate the heat accumulated in the photocoupler device. This heat is produced notably by the operation of the light source.

SUMMARY OF THE INVENTION

It is the object of the invention to mitigate these disadvantages.

Actually, the present invention relates to a photocoupler device as defined above, wherein the shield comprises a transparent thermoplastic material.

In fact such materials have several advantages. They are cheap, not very fragile, resistant, flexible, and their optical transmission is excellent. Moreover, it is possible to find thermosetting resins, for fixing the emitter and the receiver at the surface of such shield having coefficients of expansion of the same order of magnitude as that of the shield, which ensures a good mechanical resistance in the long run, and such that, since the indices of refraction are very close, the optical transmission, if any, is excellent, if the fixing of the emitting and receiving crystals on the shield is effected with their emissive and photosensitive faces for there will be no internal reflection.

A thermoplastic material may be chosen whose coefficient of expansion is between $50.10^{-6}$ and $70.10^{-6}$ and whose index of refraction is between 1.5 and 1.6. Advantageously, amorphous transparent plastic polyamide material will be chosen either of the type of those which are obtained by polycondensation of diacids and diamines, or of the type of those which are obtained by polyaddition of aminoacids. Such plastic materials can notably be united with transparent epoxide resins either of the cycloaliphatic type with hexahydrophthalic acid anhydride as a hardener, or of the type bisphenol A with an amine hardener.

Moreover, such thermoplastic materials readily accept metallization which may be useful either to receive soldering or to serve as electrostatic screens. In order to facilitate adhesion, the surface of the shield is preferably given a glossy state.

The thermoplastic materials may also receive a charge made of transparent mineral powders or of other transparent thermoplastic materials capable of modifying the mechanical and electrical properties without influencing the optical properties.

Finally, since such materials can be molded, it is possible to manufacture said elements easily and at low cost and to give them structures facilitating their assembly and handling.

Preferably, the shield has substantially the profile of a prism, which profile facilitates the introduction of the shield in the various photocoupler models. The angle of the walls of the prism is always very small and in fact its principal plane may thus be assimilated with either wall or with the median plane. The prism may alternatively be a foil having parallel faces.

In order to facilitate the assembly and the centering of the shield, and for easy manipulation thereof, the shield is advantageously supported by a base of which at least a part is substantially perpendicular to the principal plane of the shield. Thus the assembly of the base and the shield constitute the coupling element.

The base is preferably manufactured from the same thermoplastic material as the shield and they constitute one assembly. The shield is generally placed in the median plane of the thermoplastic insulating base in such manner that the said element obtains the form of a T.

In order to further facilitate the manipulation, applicant has found it advantageous to add to the T a projecting manipulation wing situated on the other side of the base opposite to the shield. Thus the coupling element comprises the shield, the base and the manipulation wing.

The branches of the T and the manipulation wing preferably have the same shape as the shield of the piece, thus generating an assembly having a cruciform section substantially having an axis and two symmetry planes.

In order to aid the assembly and the centering of the base in the photocoupler device, the base comprises, if desired, lugs which are to bear on the supports of the emitter and the receiver.

Experience has established that in the products developed by Applicants which include such a shield, the insulation between the emitter and the receiver is considerably improved, while in addition the transfer efficiency remains in the same range of values as that of conventional devices. In fact due to the presence of the shield, it is impossible for the connection wires of the emitter and the receiver to accidentally come too close together or contact each other. Moreover, such shields can easily be manufactured by molding, their geometry is reproducible, their assembly presents no problem whatsoever and their cost is low.

In addition, such a shield is no longer fragile, and it is even resistant to shocks and may serve as a frame for the assembly of the device. In addition it favors thermal dissipation.

The present invention relates more in particular to such a device which is mainly remarkable in that between the emitter and the receiver are interposed successively a first layer of a dielectric transparent material adhering to the emitter, then the shield of a thermoplastic material adhering on one to the first layer and on the other side to a second layer of the dielectric transparent material adhering itself to the receiver, the index of refraction and the coefficient of expansion of the dielectric material being near those of the thermoplastic material.

The first and second layers are advantageously of a thermosetting resin. The thermosetting resin material and the thermoplastic material are such that the thermosetting material adheres to the said thermoplastic material and such that the thermoplastic material can readily withstand the conditions of temperature required for the assembly and for the polymerization treatment of the thermosetting material and also for that of a molding resin which covers the assembly of the device. It is notably necessary that the optical qualities be preserved.

Advantageously, as already described above, the thermoplastic material chosen is an amorphous transparent plastic polyamide material either of the type of those which are obtained by polycondensation of diacids and of diamines, or of the type of those which are obtained by polyaddition of aminoacids and, as a thermosetting material, a transparent epoxide resin either of the cycloaliphatic type with hexahydrophthalic acid anhydride as a hardener or of the type bisphenol A with an amine hardener.

The results obtained with such a device are quite remarkable.

In fact, the liquid combinations of the thermosetting resins described above do not make the thermoplastics opaque and, without influencing their optical coupling, the emitter and the receiver are perfectly insulated from each other, for the presence of the shield makes it impossible for the connection wires, connecting the semiconductor regions of the crystals comprising the emitter and the receiver to external electric connections, to come in the proximity of each other or to contact each other accidentally.

By a suitable choice of the resin and of the thermoplastic material and with a suitable treatment, an optically homogeneous mass is obtained which is mechanically very rigid and electrically insulating both after the manufacture and in the long run.

The rigidity of the device results from its compactness due to the fact that the connection wires are embedded, and from its shock resistance and its elasticity due to the shock resistance and the elasticity of the materials used. Advantageously, and the difference between the coefficient of expansion of the thermoplastic material and the coefficient of expansion of the resin is less than 10% of their value.

Hence, the increase in temperature inherent in the operation of an electroluminescent device and sometimes also in that of a photoreceiver does not result in the embrittlement of the device in the long run.

In order to approach, as close as possible, the coefficients of expansion of the metallic or non-metallic elements constituting the photocoupler device, Applicants have judged it suitable to use substances whose coefficient of expansion is between $50.10^{-6}$ and $70.10^{-6}$, knowing that for so-called "natural" resins, that is to say without mineral charges, these values are the lowest one could hope.

Due to the fact that the indices of refraction are close together, the optical transmission is excellent, there is little or no internal reflection.

All the light transmitted from the electroluminescent diode to the first layer of the thermosetting material, situated between the electroluminescent diode and the shield of thermoplastic material, is transmitted to the shield and likewise from the said shield to the second layer of thermosetting material and from there to the photoreceiver. Advantageously, the difference between the index of refraction of the thermosetting material and that of the thermoplastic material is lower than 7% of their value. Applicants have estimated it suitable to use bodies having indices of refraction between 1.5 and 1.6.

Experience has demonstrated to Applicants that the electric insulation thus obtained is quite remarkable, both as regards the ambient temperature and in high temperature conditions, notably 80° C. for which test temperature no abnormal increase in the dark current of the phototransistor is established. It is possible to choose among the thermoplastic materials a material of high dielectric strength, for example, an amorphous polyamide of double dielectric strength of that of materials used up till now, namely 40 kV/mm. In fact it is known that the amorphous state of such a material is connected with its transparency. The insulation obtained is highly reproducible and hence after manufacture, the initial unit control which is long, expensive, dangerous for the personnel and may destroy the device, may thus be replaced by a control by sampling. Moreover, and essentially, the leakage currents on the photoreceiver do not appear in the long run, which is particularly important for applications in telephony. This probably results from the fact that, at the most delicate points, the heterogenous structure of the insulating mass makes the creation of conductive paths impossible.

It is well-known that thermosetting resins consist of by molecules which theoretically are infinite, while in thermoplastic materials the molecules are maintained together by physical forces such as the so-called van der Waals forces. Due to the inhomogeneity on the molecular plane, these two groups of material react differently to numerous agressions, for example, to that of water vapor. For this reason, the conductive paths are not created in the same manner in the two materials and are interrupted at their interface or cannot be created.

Additionally, the emitter and the receiver are each advantageously mounted on a metallic support, also ensuring the electric connections. In this case, the contour of the shield may project beyond that of the supports of the light emitter and the light receiver, the path of a possible leakage current between the latter being elongated in such proportions that the possibilities of an effect on the characteristics of the photocoupler device become substantially negligible.

Advantageously, it is possible to dispose, on the interface between the shield and at least one of the layers of the thermosetting material, at least one local metal shield. The metal shield functions as an electrostatic shield in order to eliminate ionization effects or that of the Faraday cage against the parasitic exterior induction phenomena. The metal shield generally comprises a film disposed by any conventional means of metallization which are well-known to those skilled in the art.

Not only can the shield be obtained simply by molding and be realized in large quantities, but the manufacture of the device is also easy to carry out and to automate.

From the following description with reference to the accompanying drawings the present invention and its advantages can be better understood.

It is to be noted that in the figures the dimensions are considerably exaggerated and not drawn to scale so as to make the drawings clearer.

DESCRIPTION OF THE PREFERRED EMBODIMENTS

Figure 1:
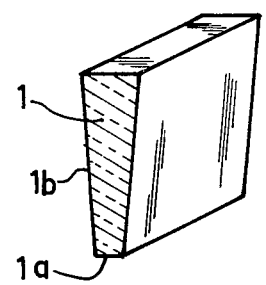
FIG. 1 is a perspective sectional view of a thermoplastic insulating element comprising only one shield which has been given the profile of a prism.

As shown in FIG. 1, the insulating shield 1 is formed from a transparent thermoplastic material, for example polyamide.

Advantageously, a transparent amorphous polyamide plastic material is chosen either of the type of those which are obtained by polycondensation of diacids and diamines, or of the type of those which are obtained by polyaddition of aminoacids.

In FIG. 1 the shield 1 has been given the profile of a prism; the minimum thickness 1a as well as the thickness 1b in the region which must normally support a high electric field are chosen as a function of the coefficient of dielectric strength of the thermoplastic material and of the distance between the light emitter and the light receiver.

The prismatic shape facilitates the possible insertion of the shield between the light emitter and the light receiver of the photocoupler.

In the figure the contour of the shield is rectangular but it might have any other shape.

The shield is advantageously manufactured by molding and it is easy to give it a glossy surface state by known molding techniques, which facilitates its possible adherence.

Figure 2:
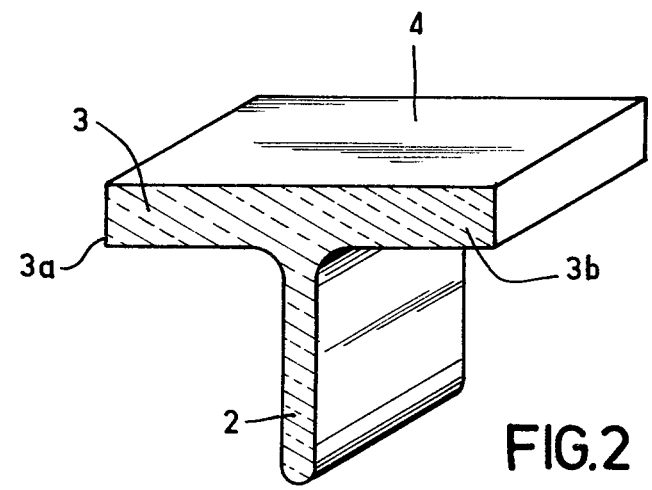
FIG. 2 shows the same view of a more elaborate embodiment of an element comprising a shield and a base giving it the form of a T.

In FIG. 2 the shield 2, similar to a strip having parallel faces of which one extremity has a rounded profile 2a, is mounted on a flat base 3 which is substantially perpendicular to the shield 2. The shield 2 and its base constitute an assembly in the form of a T.

Generally, the branches 3a and 3b of the base 3 are destined to bear on the supports of the emitter and the receiver of the photocoupler to be formed, the shield 2 being automatically inserted between the emitter and the receiver.

In a current embodiment, the thickness of the shield 2 is between 0.1 and 0.2 mm, and the thickness of the base 3 is of the order of 0.7 mm. The overall dimensions of the shield 2 and of the base 3 are 4 mm long, 2 mm high and substantially 3 mm wide.

Figure 3:
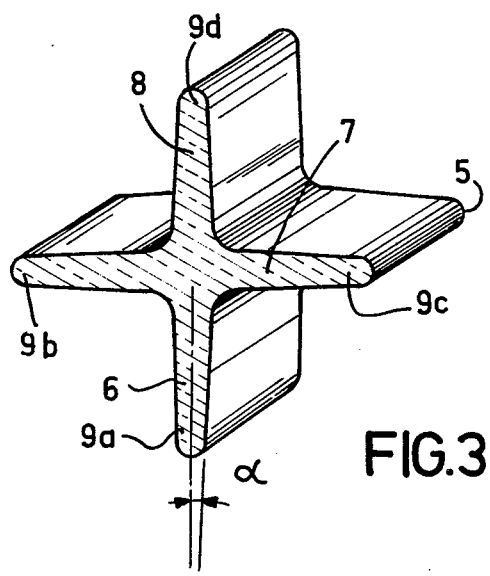
FIG. 3 shows the same view of a modified embodiment of the T comprising in addition a manipulation wing.

FIG. 3 shows a symmetrical example of an element 5 having a cruciform profile such that wings 9a, 9b, 9c and 9d having a triangular section can each constitute a shield 6, its base 7 or the manipulation wing 8.

In applicants preferred embodiment the thickness of each of the wings is of the order of 0.15 mm in its widest part and the angle $\alpha$ which the wall of each of the wings makes with its symmetry axis or with an axis parallel to the symmetry axis is substantially equal to 2°.

The manipulation and the registering of such an assembly are much easier since, when starting the manufacturing operation, each of the wings can be used as a screen, as a base or as a manipulation wing.

Figure 4:
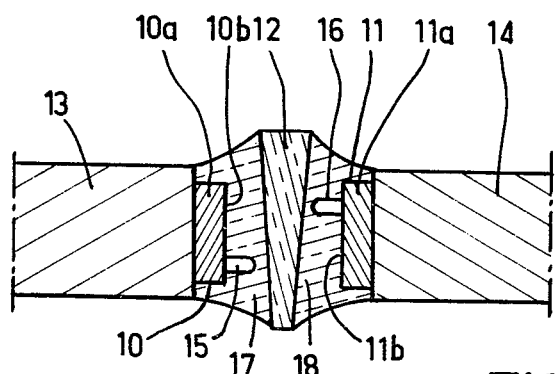
FIG. 4 is a diagrammatic sectional view of a photocoupler device comprising an element having a single shield.
Figure 5:
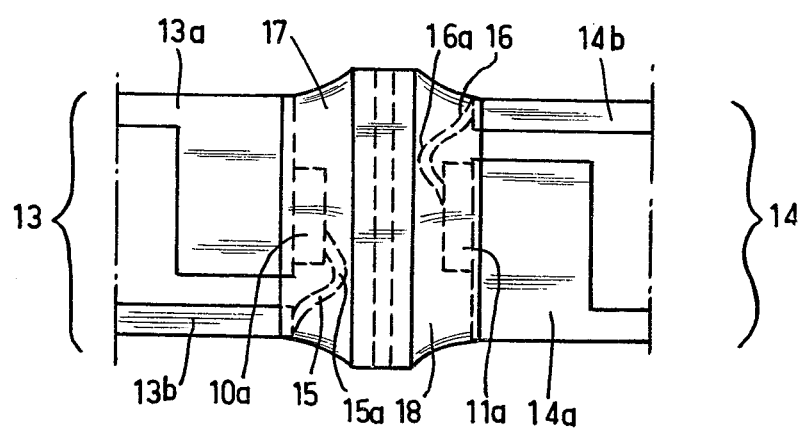
FIG. 5 is a plan view of the same device of FIG. 4.

In accordance with FIGS. 4 and 5 showing a first example of the application of the thermoplastic insulating element according to the invention, the opto-electronic photocoupler device in which the shield according to the invention is used comprises essentially a light emitter 10 and a photoreceiver 11 placed opposite to each other and each comprising principally a body referenced "a" and an active face (emitter or receiver) referenced "b".

In the first example, the emitter 10 and the receiver 11 are each mounted with their rear face (not referenced in the figures) on metallic supports 13 and 14, respectively, which also constitute the electric connections between which the desired insulation should be present.

In this example, the supports 13 and 14 are divided into two elements referenced "a" and "b" shown in FIG. 5. The crystals are soldered with their rear face to the elements referenced "a" forming an electric connection with one of the crystals. The elements referenced "b" are connected to a first extremity of flexible connections 15 and 16 of which the second extremity is soldered to a contact (not referenced) and situated on the active faces 10b and 11b of the crystals.

Owing to manipulation difficulties the connections are frequently of a less regular shape than those shown in the figures, yet in any case they always have at least one convexity of which the summits are referenced 15a and 16a.

According to the present invention, a shield 12 of a thermoplastic material is situated between the active faces 10b and 11b and is interposed between a first layer 17 and a second layer 18 of a thermosetting material to which it adheres. In addition, the layer 17 adheres to the the active face 10b of the emitter crystal 10 and the layer 18 adheres to the active face 11b of the receiver crystal 11.

In the usual applications of such photoreceivers the voltage difference between on the one hand the assembly of the metallic support 13, the crystal 10 and the connection 15 and on the other hand the assembly of the metallic support 14, the crystal 11 and the connection 16 is very high, several hundred or several thousand volts. On the other hand, the voltage difference between the portions 13a and 13b of support 13, as well as the voltage difference between the portions 14a and 14b of the support 14 are much lower, of the order of at most a few volts.

It will be obvious from FIGS. 4 and 5 that the spaces where the insulation is particularly difficult to obtain and to maintain are the space between the high point 15a of the connection 15 and, in the face 11b of the crystal 11, the surface, non-referenced in the figures, which is situated opposite to that high point as well as the analogous space between the high point 16a of the connection 16 and, in the face 10b of the crystal 10, the surface, non-referenced in the figures, which is situated opposite to the latter high point.

It will also be obvious from the figures that, as a matter of fact, the spaces are divided into three zones by the two layers 17 and 18 and by the presence of the shield 12. The dielectric strength of the thermoplastic material imposes an excellent insulation. Moreover, as already said above, the heterogenity of the zones and the presence of the interfaces (not referenced in the figures) prevent the formation of conduction paths causing bad insulation and leakage currents.

Figure 6:
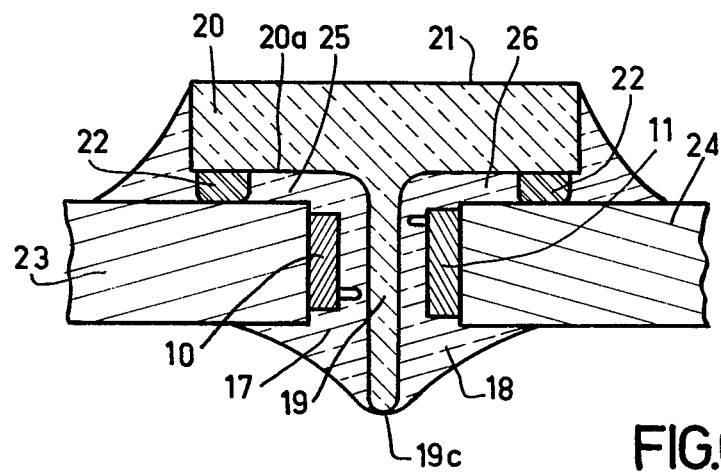
FIG. 6 is a diagrammatic sectional view of a part of a photocoupler device comprising an element according to the invention in the form of a T.
Figure 7:
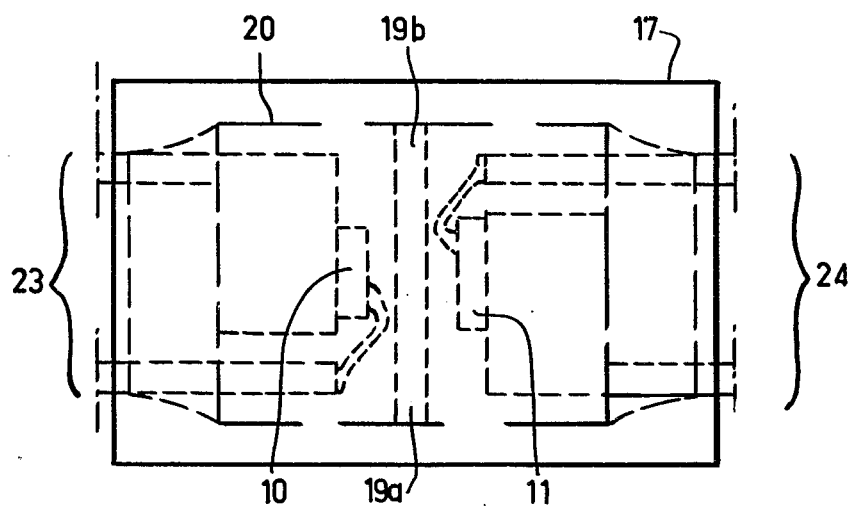
FIG. 7 is a plan view of the device shown in FIG. 6 after embedding in a closed envelope.

In the second example of the application of the thermoplastic insulating element according to the invention, shown in FIGS. 6 and 7, the shield 19 is connected to a base 20 with which it constitutes a thermoplastic insulating element 21 in the form of a T.

The element 21 bears on the supports 23 and 24 through the intermediary of spacers 22 which are usually projections or studs of thermoplastic material manufactured prior to the assembly of the photocoupler and which are situated on the face 20a of the base 20 opposite to the supports.

It may be seen from FIGS. 6 and 7 that the shield 19 has been given a much larger area than that of the section of the supports 23 and 24. In fact, it is known that the insulation at the surface of the insulations is always much more aleatory. The disposition chosen in the present example permits of lengthening the path of any stray current going from the layer 17 to the layer 18 or vice-versa, by forcing any superficial leakage current to pass notably through the extremities 19a, 19b or 19c.

Figure 8:
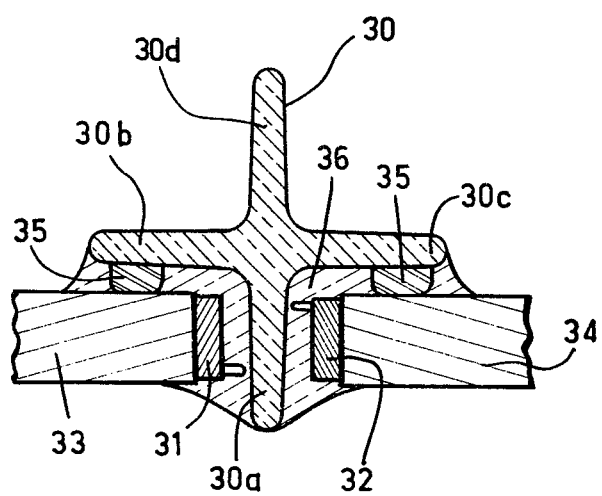
FIG. 8 is a diagrammatic sectional view of a part of a device according to the invention comprising a cruciform element having a manipulation wing.

FIG. 8 shows a particularly symmetrical example of a photocoupler assembly comprising a cruciform insulating element 30 such as that described with reference to FIG. 3.

The wings 30a, 30b, 30c and 30d, of the thermoplastic insulating element which are of a slightly triangular profile may indifferently constitute either the shield placed between the emitter 31 soldered on the support 33 and the receiver 32 soldered on the support 34, or the branches of the base bearing on the supports 33 and 34 through the intermediary of the spacers 35, the remaining wing serving as a means to manipulate the element.

In the example shown, the wing 30a serves as the shield, the wings 30b and 30c are the branches of the base, and the wing 30d serves as a manipulation wing.

The thermosetting material 36 envelopes the emitter 31 and receiver 32 and adheres to the walls of the shield 30a, the supports 33 and 34, and the spacers 35, and to one wall, non-referenced in the figure, of the branches 30b and 30c which constitute the base.

In this embodiment, the thickness of each of the wings 30 is preferably of the order of 0.15 mm in its widest part and the angle α which the wall of each of the wings makes with its symmetry axis or with an axis parallel to the symmetry axis is substantially equal to 2°. The length of the shield remains equal to 4 mm and the overall width of the order of 2 mm.

It will be obvious that the manipulation of such an element is much easier than that of any other element since any wing presenting itself to the manipulator may be used for the manipulation and since any wing may be used as a shield, the two wings situated in the plane perpendicular to that of the shield constituting necessarily the support.

The photocoupler device according to the present invention can be manufactured in a simple manner. Each crystal is fixed on its support, then the assembly of the two crystals opposite to each other at an adequate distance is realised. By a suitable means, an adequate thermosetting resin in the pasty state is disposed on both sides of the shield which is inserted between the said crystals. The resin is then transformed to the solid state. One may proceed by coating the light emitter and the light receiver crystals in the thermosetting material. The shield may alternatively be coated on both sides.

Whether the crystals or the shield is coated or both, the coatings are effected before inserting the shield between the crystals.

In the former case, where the crystals are coated with the thermosetting dielectric material, it would be advantageous to mount a number of emitter crystals and an equal number of receiver crystals on supports in the form of a comb, then immerse all the crystals in the thermosetting dielectric material and finally to insert the shields one by one in a chain.

In the latter case when the shield is coated with a layer of the thermosetting material, it would be advantageous immerse the shield in the material, then insert the shield between the emitter and the receiver crystals, and then complete the deposition of the thermosetting material by forming a layer of the material covering the assembly.

Alternatively the shield may be inserted between the emitter and the receiver and then the assembly may be enveloped by a layer of the thermosetting material.

The example described below refers to the device shown in FIGS. 6 and 7.

After mounting the crystals 10 and 11 on their supports 23 and 24 opposite to each other, the shileld 19 and at least the face 20a of the base 20 is embedded in a sufficient mass of thermosetting resin.

The manipulation of the element 21 is made easier by the presence of the base 20.

Advantageously, the supports 23 and 24 each constitute a metallic comb comprising a plurality of identical patterns to each of which a photocoupler is mounted. In this case, the operation of providing and centering the emitter and the receiver crystals may be made automatic and reproducible.

Between the emitter and the receiver the shield 19, which is previously coated is then inserted and the spacers 22 of the base 20 are made to bear on the supports 23 and 24.

The thermosetting resin covering the shield 19 and the face 20a of the base 20 will constitute the layers 17, 18, 25 and 26.

If necessary, a thermal treatment is then carried out so as to solidify the dielectric materials as rapidly as possible, for example at 120° C. for one hour in dry air.

In experiments preformed by applicant the thermoplastic material was the product resulting from the polycondensation of a hexamethylene diamine alkyl substituted with terephthalic acid sold by the Societe Dynamit-Nobel under the name of Trogamid T having an index of refraction equal to 1.566.

Alternatively, the products may be used resulting from the polycondensation of hexamethylene diamine either with adipic acid, or with sebacic acid, as well as other amorphous and transparent thermoplastic polyamide materials obtained either by polycondensation of the diacids and diamines, or by polyaddition of amino acids. The product sold by BASF under the name of Ultramid may be used, for example.

In the same experiments the thermosetting material, used to form the dielectric transparent layers, was a transparent epoxide resin. Resins of the cycloaliphatic type, or example, 3,4-epoxycyclohexyl-methyl-3,4-epoxycyclohexane carboxylate have been used. This product, of which the index of refraction is 1.56, is sold by CIBA under the name of Araldite CY 179. With this product applicant has used as a hardener the anhydride of hexahydrophthalic acid (H.H.P.A.). Resins of the bisphenol A type have also been used, for example, diglycidyl ether of bisphenol A, which product has an index of refraction equal to 1.58 and is sold by the Company of CIBA under the name of Araldite D. This resin has been used with an amine hardener, for example the diethyl amino propyl amine product sold by the same Company under the name of HY 951.

Hence these thermosetting materials have an index of refraction between 1.54 and 1.58, which makes them compatible with both Ultramid, having an index of refraction equal to 1.53, and Trogamid T, having an index of refraction equal to 1.566. Moreover, the various materials have substantially the same coefficients of expansion, from $50.10^{-6}$ to $70.10^{-6}$ Taking into account their very high adhesive capacity, the resins adhere perfectly together, to the metallic supports and to the semiconductor crystals.

The various resins used present the property of becoming hard, this being due to their chemical composition. In this case a rigid assembly is obtained the supports 23 and 24, the crystals 10 and 11, the layers 17, 18, 25 and 26, and the element 21, comprising notably the shield 19 and the base 20.

After solidification of the various dielectric materials, the assembly thus formed is embedded in an opaque resin forming a closed envelope referenced 17 in FIG. 7.

In one embodiment, the thickness of the shield 19 is between 0.1 and 0.2 mm, the thickness of the base 20 is of the order of 0.7 mm and that of the spacers 22 is approximately 0.3 mm. In this case, it can be estimated that the overall dimensions of the shield and its base are 4 mm long, 2 mm high and substantially 2 mm wide.

In a modified embodiment of the method according to the invention, the crystals 10 and 11 and their supports 23 and 24, as well as the element 21 are provided in a mold having an appropriate shape and the assembly is enveloped by a layer of the dielectric thermoseting material which, by capillarity, penetrates into all the interstices. When the thermosetting material is solidified, the assembly is embedded in a resin which is opaque to radiation.

The devices thus obtained by a simple method are compact, mechanically resistant, and invariable in time, and have a very good optical efficiency, and an excellent insulation. The insulation is sufficiently reliable so that a separate expensive unit control which is dangerous and often destructive becomes superfluous.

What is claimed is:

1. A photocoupler device comprising:
   a light emitter having electrical connections;
   a photosensitive receiver having electrical connections and being situated opposite the light emitter, said emitter and said receiver being coupled optically along an optical axis;
   an insulating element comprising a substantially planar shield, said shield providing electrical insulation between the light emitter and the photosensitive receiver, and a base, said base being situated in a plane substantially perpendicular to said shield, said base having two faces with said shield being situated on one face, and said base having two branches which are substantially symmetrical with respect to the shield, a profile of the insulating element having substantially the form of a "T", wherein said insulating element comprises an amorphous transparent thermoplastic polyamide;

a layer of a dielectric transparent material adhering to and situated between the emitter and the shield;

a layer of a dielectric transparent material adhering to and situated between the receiver and shield, the index of refraction and the coefficient of expansion of each of the dielectric materials being near those of the polyamide; and wherein the emitter and the receiver are mounted on separate supports and the base bears on said supports.

2. A photocoupler device as claimed in claim 1, wherein characterized in that the profile of the shield is that of a prism.

3. A photocoupler device as claimed in claim 1, wherein the profile of the shield is that of a plate having parallel faces.

4. A photocoupler device as claimed in claim 1, wherein the insulating element further comprises a manipulation wing situated on the face of the base opposite to the shield.

5. A photocoupler device as claimed in claim 4, wherein the shield the manipulation wing and the two branches of the base are substantially identical, the profile of the element being substantially cruciform.

6. A photocoupler device as claimed in claim 5, wherein the shield has at least two surfaces and at least the surface of the shield is glossy.

7. A photocoupler device as claimed in claim 6, wherein at least surface of the shield is metallized.

8. A photocoupler device as claimed in claim 7, wherein the face of the base, which is turned towards the shield, comprises lugs.

9. A photocoupler device as claimed in claim 1, wherein the difference between the coefficient of expansion of the thermoplastic material and the coefficient of expansion of the said dielectric material is less than 10% of their value.

10. a photocoupler device as claimed in claim 9, wherein characterized in that the difference between the index of refraction of the dielectric material and that of the thermoplastic material is less than 7% of their value.

11. A photocoupler device as claimed in claim 10, wherein the characterized in that the said dielectric material is a thermosetting resin of which the conditions of molding and of the polymerization treatment are compatible with a good behavior of the thermoplastic material.

* * * * *

UNITED STATES PATENT OFFICE
CERTIFICATE OF CORRECTION

Patent No. 4,237,382          Dated December 2, 1980

Inventor(s) JACQUES C. THILLAYS

It is certified that error appears in the above-identified patent and that said Letters Patent are hereby corrected as shown below:

Col. 11, line 12, Delete "characterized in that"

Col. 12, line 12, Before "dielectric" delete "said"

Col. 12, line 14, After "10." change "a" to --A--

Col. 12, line 15, Delete "characterized in that"

Col. 12. line 20, Delete "characterized in that the said"

Signed and Sealed this

Twenty-first Day of April 1981

[SEAL]

Attest:

RENE D. TEGTMEYER

Attesting Officer     Acting Commissioner of Patents and Trademarks